(12) United States Patent
Dubois et al.

(10) Patent No.: US 10,240,871 B2
(45) Date of Patent: Mar. 26, 2019

(54) METHOD FOR CALIBRATING AN ANNEALING FURNACE USED TO FORM THERMAL DONORS

(71) Applicant: COMMISSARIAT A L'ENERGIE ATOMIQUE ET AUX ENERGIES ALTERNATIVES, Paris (FR)

(72) Inventors: Sébastien Dubois, Scionzier (FR); Jordi Veirman, Poisy (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 168 days.

(21) Appl. No.: 15/385,241

(22) Filed: Dec. 20, 2016

(65) Prior Publication Data
US 2017/0176105 A1  Jun. 22, 2017

(30) Foreign Application Priority Data

Dec. 21, 2015  (FR) ..................................... 15 62979

(51) Int. Cl.
*G01K 19/00* (2006.01)
*G01K 13/00* (2006.01)
(Continued)

(52) U.S. Cl.
CPC ............. *F27D 19/00* (2013.01); *C30B 29/06* (2013.01); *C30B 33/02* (2013.01); *F27D 11/02* (2013.01); *F27D 2019/0003* (2013.01)

(58) Field of Classification Search
USPC ..................................................... 374/1, 141
See application file for complete search history.

(56) References Cited

U.S. PATENT DOCUMENTS

2009/0261299 A1  10/2009  Watanabe et al.
2013/0158889 A1*  6/2013  Veirman ................. G06F 17/11
                                                  702/24

FOREIGN PATENT DOCUMENTS

FR    2 964 459 A1    3/2012
FR    2 997 096 A1    4/2014

OTHER PUBLICATIONS

Search Report as issued in French Patent Application No. 1562979, dated Aug. 25, 2016.
(Continued)

*Primary Examiner* — Mirellys Jagan
(74) *Attorney, Agent, or Firm* — Pillsbury Winthrop Shaw Pittman LLP

(57) ABSTRACT

A method for calibrating a furnace enabling a semiconductor material to be subjected to a first thermal donor formation annealing that includes a temperature rise, a first temperature plateau and a temperature drop of the furnace, the method to including providing a calibration piece of the semiconductor material; determining the interstitial oxygen concentration of the piece; subjecting the piece to a second thermal donor formation annealing in the furnace, the second annealing including rise and drop in temperature of the furnace identical to those of the first annealing and a second plateau at the set temperature for a set time; determining the concentration of thermal donors formed in the piece during the second annealing; determining an equivalent annealing time at the set temperature, corresponding at least to the rise and drop in temperature of the furnace, from the interstitial oxygen concentration, the thermal donor concentration of the piece and the set time.

9 Claims, 4 Drawing Sheets

(51) Int. Cl.
    *F27D 19/00*     (2006.01)
    *F27D 11/02*     (2006.01)
    *C30B 33/02*     (2006.01)
    *C30B 29/06*     (2006.01)

(56) References Cited

OTHER PUBLICATIONS

Londos, C. A., et al., "Effect of oxygen concentration on the kinetics of thermal donor formation in silicon at temperatures between 350 and 500° C.," Applied Physics Letters, vol. 62, Mar. 29, 1993, XP002402566, ISSN: 0003-6951, pp. 1525-1526.
Wijaranakula, W., "Formation kinetics of oxygen thermal donors in silicon," Applied Physics Letters, vol. 59, No. 13, Jan. 1, 1991, XP055114038, ISSN: 0003-6951, pp. 1608-1610.
Jay, F., et al., "High Quality Thermal Donor Doped Czochralski Silicon Ingot for Industrial Heterojunction Solar Cells", EU PVSEC Proceedings 2015, pp. 316-321.

\* cited by examiner

METHOD FOR CALIBRATING AN ANNEALING FURNACE USED TO FORM THERMAL DONORS

CROSS-REFERENCE TO RELATED APPLICATIONS

This application claims priority to French Patent Application No. 1562979, filed Dec. 21, 2015, the entire content of which is incorporated herein by reference in its entirety.

FIELD

The present invention is relative to the manufacture of wafers from an ingot made of semiconductor material. The invention more particularly relates to a method for calibrating an annealing furnace used to create thermal donors in a sample of semiconductor material, such as a section of ingot or a brick cut from the ingot.

BACKGROUND

Silicon wafers used for the manufacture of high efficiency photovoltaic cells are generally derived from ingots made of monocrystalline silicon obtained by the Czochralski (Cz) pulling method. These wafers are preferentially n-typed doped, by introducing electron donor phosphorous atoms into the silicon. An n-type doping with phosphorous (P) is preferred to a p-type doping with boron (B), notably because of the absence of boron-oxygen complexes that reduce the lifetime of the charge carriers in the silicon.

Phosphorous is incorporated in the silicon before the pulling of the ingot, when the silicon is in the molten state, by adding to the silicon melt a phosphorous powder or silicon wafers highly doped with phosphorous. This doping technique has drawbacks, which include the contamination of the silicon. In fact, the phosphorous powder or the silicon wafers added to the melt also contain metals and carbon. These impurities are incorporated in the silicon at the same time as the phosphorous, which leads to a contamination of the silicon, firstly at the level of the melt, then at the level of the ingot. Moreover, given that the segregation coefficient of phosphorous is low (around 0.35), a significant variation in the phosphorous concentration, and thus in the electrical resistivity, appears over the height of the ingot. Yet the performances of photovoltaic cells are dependent on the electrical resistivity. Photovoltaic cells obtained from the ingot will then not have the same performances, and notably the same photovoltaic conversion efficiency. Thus, a portion of the ingot risks being unusable, which represents a financial loss for the wafer supplier.

To avoid these drawbacks, another doping technique involving thermal donors has been developed. It is described in the article ["High Quality Thermal Donor Doped Czochralski Silicon Ingot for Industrial Heterojunction Solar Cells", F. Jay et al., EU PVSEC Proceedings 2015, pp. 316-321]. The thermal donors are agglomerates created from the interstitial oxygen contained in the silicon (i.e. the oxygen atoms occupy interstitial positions in the crystal lattice), when it is subjected to a temperature comprised between 350° C. and 550° C. Each thermal donor generates two free electrons, which produces a variation in the electrical resistivity of the silicon.

This doping technique enables wafers of practically identical resistivity and only containing very few impurities to be obtained. Firstly, an ingot made of monocrystalline silicon is crystallised from a silicon melt, by means of the Czochralski method. The silicon used to prepare the melt is intrinsic and no dopant has been voluntarily introduced into the melt. In these conditions, the resistivity of the ingot only depends on the thermal donors concentration. The interstitial oxygen concentration and the initial concentration of thermal donors, formed during the crystallisation, are then measured over the height of the ingot. A concentration of additional thermal donors, to be created to reach a target resistivity, may then be calculated, for each height of the ingot. These additional thermal donors are formed during an annealing at 450° C. For each height of the ingot, the annealing time required to obtain additional thermal donors is calculated, knowing the interstitial oxygen concentration. The ingot is then cut into sections. Each section corresponds to an annealing time, because the calculated annealing times are substantially identical in a same section. Finally, each section of ingot is subjected to annealing at 450° C. for the corresponding time, before being cut into wafers.

The most critical step of this wafer manufacturing method is the annealing at 450° C. of the different ingot sections. It is necessary in fact to avoid sudden to variations in temperature when a section is introduced into the annealing furnace, then taken out of the furnace, because the section can break. Consequently, it is advisable to increase progressively the temperature after having introduced the section into the furnace, and to reduce it just as progressively before extracting the section from the furnace. The problem is that it is then difficult to know the exact time of formation of thermal donors. In fact, thermal donors are also formed during the heating phase (from 350° C. to 450° C.) and the cooling phase (from 450° C. to 350° C.) of the furnace. The quantity of additional thermal donors formed during the annealing then differs from that calculated from the target resistivity and the target resistivity is not finally reached.

SUMMARY

There thus exists a need to provide a method for calibrating a furnace, making it possible to control in a precise manner the formation of thermal donors when a sample of semiconductor material is subjected in this furnace to a first annealing, the first annealing successively comprising a rise in temperature of the furnace, a first plateau at a set temperature and a drop in temperature of the furnace.

According to an aspect of the invention, this need tends to be satisfied by providing the following steps:
 a) providing a calibration piece comprised of the semiconductor material;
 b) determining the interstitial oxygen concentration of the calibration piece;
 c) subjecting the calibration piece to a second thermal donor formation annealing in the furnace, the second annealing comprising rise and drop in temperature of the furnace identical to those of the first annealing and a second plateau at the set temperature for a set time;
 d) determining the concentration of thermal donors formed in the calibration piece during the second annealing; and
 e) determining an equivalent annealing time at the set temperature, corresponding at least to said rise and drop in temperature of the furnace, from the interstitial oxygen concentration, the thermal donor concentration of the calibration piece and the set time.

In other words, this calibration method makes it possible to determine the annealing time at the set temperature, for example 450° C., which corresponds at least in part to the heating and cooling phases of the furnace. Knowledge of such information is precious, in particular within the scope of the method for manufacturing wafers described previously. In fact, it is thus possible to take account of thermal donors formed during the heating and cooling phases of the furnace, when the furnace is configured to carry out the annealing of sections of ingot. The quantity of additional thermal donors formed by the annealing then comes closer to that calculated from the target resistivity. The calibration method thus enables the adjustment of electrical resistivity by thermal donors to be more precise.

The second temperature plateau, between the rise and drop in temperature of the second annealing, leaves more time for the calibration piece to reach the set temperature. Thus, the rise and drop in temperature of the calibration piece correspond to those that the sample undergoes during the first annealing (the first annealing comprises the first plateau at the set temperature).

This second plateau moreover makes it possible to take into account the differences between the temperature of the sample and the set temperature in determining the equivalent annealing time, and thus potential phenomena of instability of the temperature of the furnace, which are passed onto the sample.

Beneficially, the calibration piece has a geometry and dimensions identical to those of the sample. Calibration precision is thus improved, because the calibration piece and the sample will undergo precisely the same rise and drop in temperature.

The set time is beneficially comprised between 30 seconds and 2 hours.

In an embodiment, steps a)-e) are carried out for a plurality of calibration pieces having different set time values, resulting in a plurality of equivalent time values, and the calibration method further comprises a step of determining the set time value beyond which the equivalent time is independent of the set time.

The calibration piece is beneficially cut from a semiconductor material ingot crystallised according to the Czochralski method, and in an embodiment, from a part of the ingot crystallised last.

The interstitial oxygen concentration of the calibration piece may then be determined by measuring the interstitial oxygen concentration on at least one scrap stemming from the cutting of the ingot, the scrap being adjacent to the calibration piece in the ingot.

The thermal donor concentration may be determined from a first measurement of the electrical resistivity or the free charge carrier concentration, carried out before the second annealing on a first wafer adjacent to the calibration piece in the ingot, and from a second measurement of the electrical resistivity or the free charge carrier concentration, carried out after the second annealing on a second wafer taken from the calibration piece.

In an embodiment, the semiconductor material ingot is obtained from a melt of intrinsic semiconductor material.

BRIEF DESCRIPTION OF THE FIGURES

Other characteristics and benefits of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION

Figure 1:
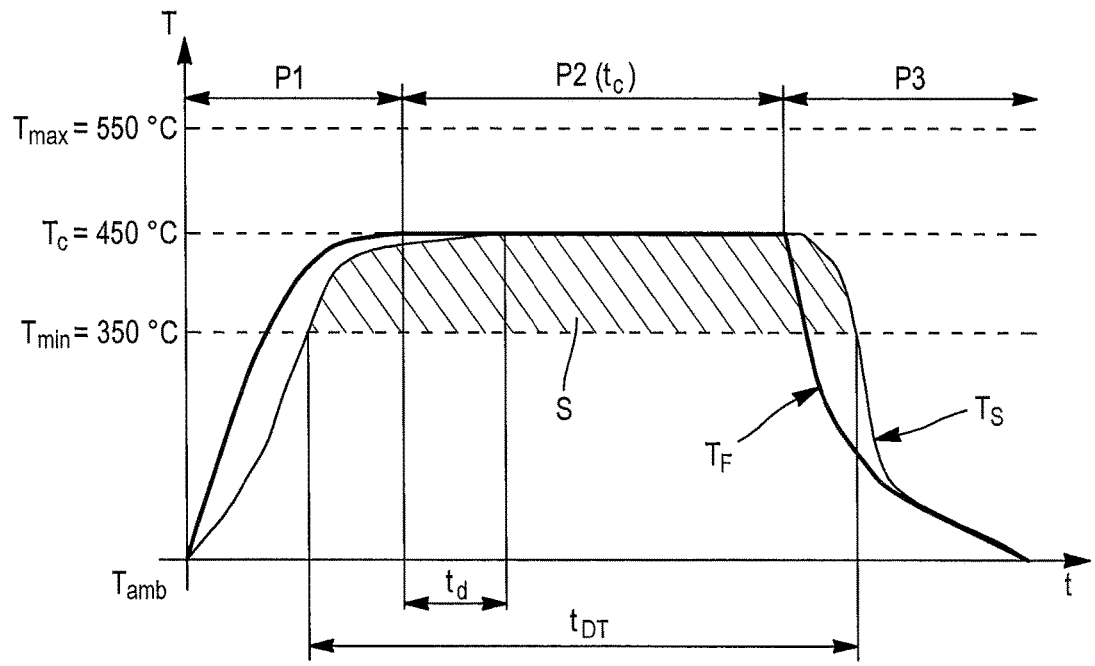
FIG. 1 represents temperature profiles of a furnace and of a semiconductor sample placed in the furnace, during a thermal donor formation annealing.

FIG. 1 shows exemplary curves of the temperature $T_F$ inside a furnace and of the temperature $T_S$ within a sample made of semiconductor material, when this sample is subjected to a thermal donor formation annealing in the furnace. The sample may be a section of ingot or a brick cut from an ingot. The brick has substantially the shape of a rectangular parallelepiped and enables square or pseudo square wafers to be obtained, which will then serve for the manufacture of photovoltaic cells. The section of ingot, of cylindrical shape, is rather intended for the microelectronics industry, where wafers are of circular shape.

The annealing of the sample comprises a heating phase P1 in which the temperature $T_F$ of the furnace rises, going from ambient temperature $T_{amb}$ (for example 25° C.) to a set temperature $T_C$. In the example of FIG. 1, the set temperature $T_C$ is equal to 450° C. The heating phase P1 is followed by a plateau P2 at the set temperature $T_C$ for a set time $t_c$. The set time $t_c$ is the annealing time, specified during the programming of the furnace, during which the furnace is deemed to be at the set temperature $T_C$ (450° C.). This annealing time is timed from the moment when the temperature $T_F$ of the furnace, measured for example by a thermocouple, reaches 450° C. When it stops, the temperature $T_F$ of the furnace begins to drop. In fact, the temperature plateau P2 is followed by a cooling phase P3, in which the temperature $T_F$ goes from 450° C. to ambient temperature $T_{amb}$.

As seen in FIG. 1, the temperature $T_S$ of the sample arranged in the furnace is not always equal to the temperature $T_F$ inside the furnace. During the heating P1 and cooling P3 phases notably, the temperature curve of the sample is delayed compared to the temperature curve of the furnace, due to the thermal inertia of the sample. This delay is symbolised in FIG. 1 by a time "$t_d$", during which the temperature $T_F$ of the furnace is equal to 450° C. whereas the temperature $T_S$ of the sample is less than 450° C.

Thermal donors are formed in the sample when its temperature $T_S$ is comprised between $T_{min}$=350° C. and $T_{max}$=550° C. Given that the temperature $T_S$ of the sample does not exceed 450° C. in the example of FIG. 1, thermal donors are here formed uniquely in the range of temperatures 350° C.-450° C. The quantity of thermal donors created during the annealing may be represented by the area S situated below the temperature curve $T_S$ and above the straight line of equation $T(t)=T_{min}=350°$ C. Generally speaking, the bigger the area S, the greater the quantity of thermal donors created (it increases with temperature and annealing to time).

It is then noted that part of these thermal donors is formed during the heating P1 and cooling P3 phases of the furnace. The time $t_{DT}$ during which the temperature $T_S$ of the sample is comprised between 350° C. and 450° C., in other words the actual time of formation of thermal donors, is greater than the set time $t_c$. Consequently, there exists a difference between the quantity of thermal donors formed during the set time $t_c$ (specified by the operator during the programming of the furnace) and the quantity of thermal donors formed by annealing as a whole.

Moreover, during the delay $t_d$ (plateau P2), the kinetic of thermal donors formation is not that expected, since the temperature $T_S$ of the sample has not yet reached the set temperature $T_C$. This delay thus contributes to creating the difference in quantities of thermal donors between the set time $t_c$ and the annealing as a whole. Nevertheless, this contribution is in general small compared to that of phases P1 and P3.

Thus, when the furnace is configured by fixing the set time $t_c$ of the plateau P2 at 450° C., it should be taken into account that the formation of thermal donors will also take place during the heating P1 and cooling P3 phases of the furnace and that the temperature $T_S$ of the sample may be different to the set temperature $T_C$ during part of the plateau P2. This makes it possible to control the quantity of thermal donors formed during annealing more precisely.

The kinetic of thermal donors formation during the heating P1 and cooling P3 phases is difficult to establish, because the exact profile $T_S(t)$ of the sample temperature is not known. It is thus not possible to determine simply which part of the thermal donors is formed during the phases P1 and P3.

The calibration method described hereafter makes it possible to circumvent these difficulties. It makes the hypothesis that the temperature of the sample during the annealing is constant and equal to 450° C., then determines the annealing time at 450° C. (uniquely), hereafter noted $t_{eq}$, equivalent on the one hand to the phases of rise and drop in temperature and on the other hand to (potential) differences between the temperatures $T_S$ and $T_C$ during the plateau P2.

Figure 2:
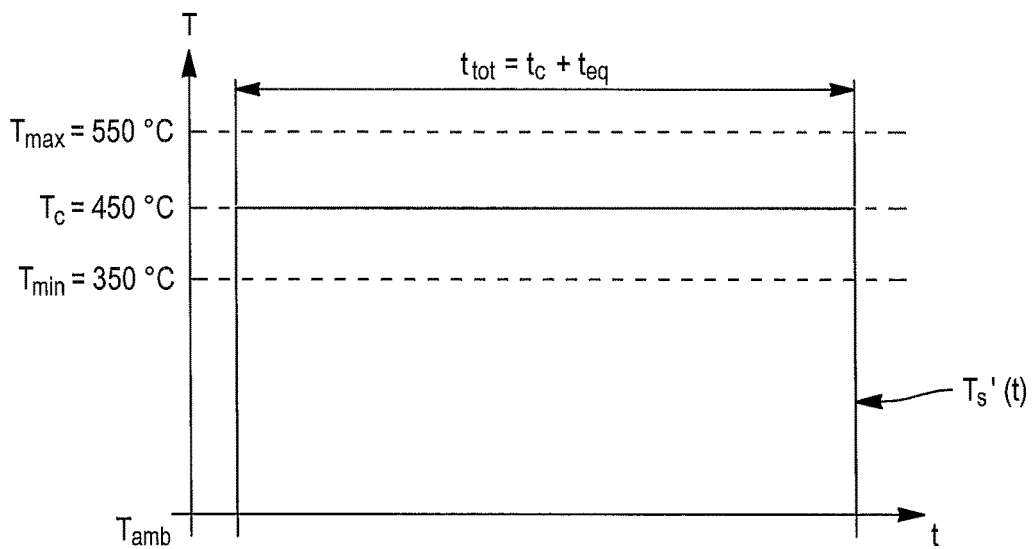
FIG. 2 represents another temperature profile, equivalent to that represented in FIG. 1, of the sample during annealing.

FIG. 2 shows the profile $T_S'(t)$ of the section temperature in such a hypotheses. This profile is equivalent to the temperature profile $T_S(t)$, varying between 350° C. and 450° C. and of time $t_{DT}$, represented in FIG. 1. The term "equivalent" used here above to designate the time $t_{eq}$ or the profile of FIG. 2 signifies that the quantity of thermal donors formed is the same.

The temperature profile $T_S'(t)$ has a crenelated shape, with instantaneous rise and drop in temperature and a plateau at 450° C. of a total time $t_{tot}$ equal to the sum of the set time $t_c$ and the equivalent time $t_{eq}$:

$$t_{tot}=t_c+t_{eq} \quad (1)$$

The equivalent time $t_{eq}$ takes account, as indicated previously, of the thermal donors formation during phases of rise and drop in temperature of the furnace and potential temperature differences during the set time $t_c$. It varies as a function of the furnace used, the heating and cooling conditions, the geometry and the dimensions of the section. In certain rare cases, in particular when the delay time $t_d$ is significant, the equivalent time $t_{eq}$ can take a negative value.

In other words, the "real" quantity of thermal donors formed during the annealing is less than that of an annealing at 450° C. (uniquely) for the set time $t_c$.

The total annealing time $t_{tot}$ at 450° C. is for example the time calculated from a "target" thermal donors concentration (itself deduced from a target resistivity value) and the interstitial oxygen concentration in the sample, according to the method for obtaining wafers described in the introduction.

Knowledge of the equivalent annealing time $t_{eq}$ at 450° C. then makes it possible to determine (using relation (1) above) the exact value of the set time $t_c$ to programme to reach the "target" thermal donors concentration.

Figure 3:
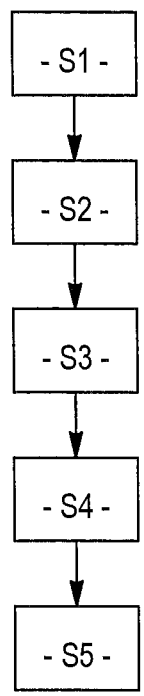
FIG. 3 represents steps of a calibration method according to an embodiment of the invention.

FIG. 3 represents steps S1 to S5 of a method for calibrating the annealing furnace allowing the equivalent time $t_{eq}$ to be determined.

At step S1, it is provided a calibration piece comprised of the same semiconductor material as the sample, in order that the kinetic of thermal donors formation can be the same. The sample and the calibration piece are for example made of crystalline silicon. Monocrystalline silicon obtained by the Czochralski method, known as "Cz" silicon, is preferred to multi-crystalline silicon from a directional solidification method in a crucible, because it has a higher interstitial oxygen concentration. Thermal donors could then be created in great quantity, which improves the calibration precision.

Thus, in an embodiment of the calibration method, the calibration piece is cut from an ingot of Cz silicon, crystallised from a silicon melt. In an embodiment, the load of silicon used to form the silicon melt is not doped, that is to say made of intrinsic silicon, and no dopant has been added to the melt. The silicon of the melt is thus intrinsic at the moment of the pulling of the ingot. Thus, the resistivity of the material will be influenced by the thermal donors uniquely, which improves the calibration precision.

For a semiconductor material other than those obtained by the Czochralski method, the interstitial oxygen concentration of the semiconductor material is beneficially greater than $10^{17}$ cm$^{-3}$. Since carbon is an element that limits the formation of thermal donors, its concentration in this semiconductor material is beneficially less than $10^{17}$ cm$^{-3}$.

Step S2 consists in determining the interstitial oxygen concentration [Oi] of the calibration piece. The interstitial oxygen [Oi] concentration may be measured directly on the calibration piece, in a non-destructive manner, by an infrared spectroscopy technique commonly known as "Whole-rod FTIR". This technique, derived from Fourier transform infrared spectroscopy (FTIR), consists in scanning to the calibration piece with an infrared beam. The absorption of the infrared beam by the calibration piece makes it possible to determine an average interstitial oxygen concentration in the calibration piece.

Alternatively, when the calibration piece has been cut from an ingot, the interstitial oxygen concentration [Oi] may be measured by FTIR on a part of the ingot that is adjacent to the calibration piece. This makes it possible to safeguard the calibration piece from the handling required for the measurement of the concentration [Oi], in particular from surface polishing. One may then be led to make the hypothesis that the interstitial oxygen concentration measured on the adjacent part is equal to the interstitial oxygen concentration [Oi] of the calibration piece.

For example, when the calibration piece is a section of ingot, the concentration [Oi] may be measured by FTIR on one of the two wafers, or slices, situated on either side of the calibration piece, or on a piece only of this wafer. In an embodiment, the wafer (or the piece of wafer) has a thickness greater than or equal to 100 µm and its surface is polished before carrying out the FTIR measurements.

Figure 4:
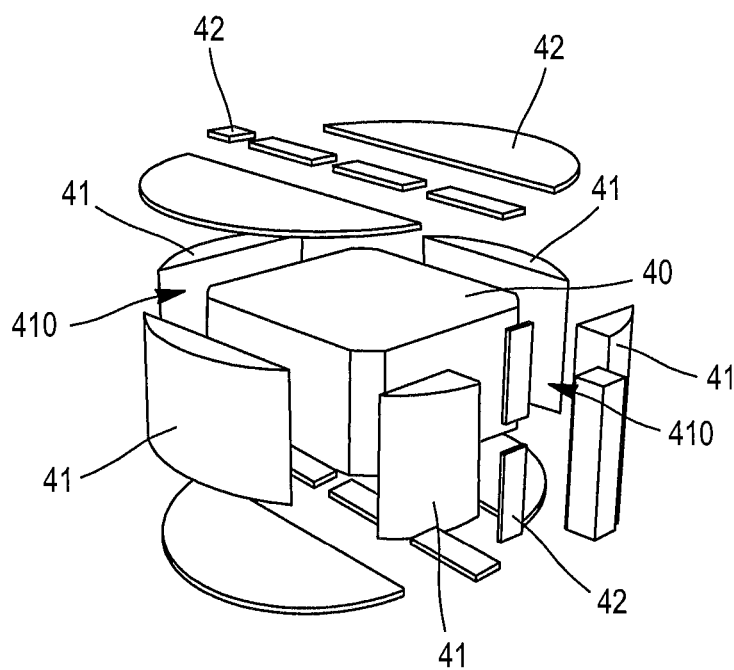
FIG. 4 illustrates a manner of obtaining a calibration piece for carrying out the calibration method according to an embodiment of the invention.

FIG. 4 represents the case where the calibration piece is a brick 40 cut from the ingot. The interstitial oxygen concentration [Oi] of the calibration piece is then beneficially measured on any of the scraps 41 stemming from the cutting of the ingot, and in an embodiment, on an internal face 410 corresponding to the cutting plane. Once again, the FTIR technique may be used (after polishing of the inner face).

FIG. 4 also shows pieces of wafer 42 situated in the ingot immediately above, below and on the sides of the calibration piece. As indicated previously, the interstitial oxygen concentration [Oi] may also be measured on any of these pieces of wafer 42. The oxygen concentration may thus be measured on several pieces of wafer 42, for example two situated respectively above and below the calibration piece, and the concentration [Oi] of the calibration piece is then assumed equal to the average value of the oxygen concentrations measured on the pieces 42.

Techniques other than infrared spectroscopy (FTIR, Whole-rod FTIR) may be used to measure the interstitial oxygen concentration [Oi] of the calibration piece. In particular, the technique described in the patent FR2964459 may be employed. This technique may be applied to a silicon wafer (as is described in the patent FR2964459), a piece of wafer 42, a scrap 41 from the cutting of the ingot or instead the calibration piece 40.

At step S3 of FIG. 3, the calibration piece is subjected to a thermal donor formation annealing comprising a rise and drop in temperature identical to those of the annealing of the sample (cf. FIG. 1). The heating and cooling conditions of the furnace are thus the same between the annealing of the sample and the annealing of the calibration piece. The temperature of the furnace during the annealing of the calibration piece reaches the set temperature $T_C$, here set at 450° C., then decreases again to ambient temperature.

The annealing S3 of the calibration piece further comprises, like the annealing of the sample, a plateau at the set temperature $T_C$ between the rise and drop in temperature. The set time of this plateau is noted hereafter $t_c'$. A plateau during the annealing S3 enables the calibration method to take into account all the potential differences between the temperature of the sample and the set temperature $T_C$ during the set time $t_c'$, including that corresponding to the delay $t_d$ between the temperature curves of the sample and the furnace, because the calibration piece may thus more easily reach the set temperature $T_C$. This plateau notably makes it possible to take into account problems of regulation of the furnace temperature at the start of the plateau. The time $t_{eq}$ (of annealing at 450° C.) is then equivalent, in terms of quantity of thermal donors formed, to the contributions of the phases of rise and drop in temperature, and potential differences in temperature during the time $t_c'$ (including the delay $t_d$).

The set time $t_c'$ of the plateau at step S3 is not necessarily equal to the set time $t_c$ to of the annealing of the sample. In fact, the objective of this plateau is only to bring the temperature of the calibration piece, during the annealing S3, closer to the temperature $T_S$ of the sample, in order to refine as much as possible the determination of the equivalent time $t_{eq}$.

In an embodiment, the calibration piece has the same geometry and the same dimensions as the sample. The calibration piece and the sample will thus respond in the same way to the rise and drop in temperature of the furnace (the thermal inertia being the same between the two pieces). This makes it possible to improve significantly the calibration precision.

Then, in S4, the thermal donors concentration [DT] formed during the annealing S3 of the calibration piece is determined. The thermal donors formed during the annealing S3 may be added to the thermal donors initially present in the calibration piece and which have been generated during the cooling of the ingot. The calibration piece may thus be subjected to a preliminary annealing to destroy these initial thermal donors, for example at 650° C. for 30 min.

The concentration [DT] is, in an embodiment, obtained from two values of the electrical resistivity or the free charge carrier concentration, measured respectively before and after the thermal donor formation annealing S3. In fact, the appearance of thermal donors leads to a variation in the free charge carrier concentration, and thus in the electrical resistivity. "Free charge carriers" is taken to mean the charge carriers (i.e. electrons or holes) that are free to circulate in the semiconductor material and which are responsible for the electrical conductivity of the material. Their concentration depends on the initial doping level of the semiconductor material (p-type or n-type), which has been accentuated or compensated by the formation of thermal donors ("electron donor" defects) in concentration [DT].

A first measurement of the resistivity—or the free charge carrier concentration—is thus carried out before the annealing S3 and a second measurement of the resistivity—or the free charge carrier concentration—is carried out after the annealing S3. The electrical resistivity may be measured by the four points method, the Van der Pauw method, by inductive coupling or be derived from measurement of the Foucault current. The free charge carrier concentration may be measured by Hall effect, by photoluminescence, by analysis of the absorption of an infrared radiation caused by free charge carriers (known as FCA (Free Carrier Absorption) analysis), or deduced from C-V measurements.

The first and second measurements are, in an embodiment of step S4, carried out in a same region of the surface of the calibration piece (40). In an alternative embodiment, the first measurement is carried out on a wafer adjacent to the calibration piece in the ingot, for example that situated immediately above or below the calibration piece (or both and the average value is then calculated), and the second measurement is carried out on a wafer taken from the surface of the calibration piece or from inside the calibration piece. The same wafer may then serve for the resistivity measurement and the determination of the oxygen concentration [Oi] (step S2).

When a resistivity measurement is carried out outside of the calibration piece, that is to say on a part adjacent to the ingot, the measured resistivity value may be extrapolated to determine the resistivity of the calibration piece. The same is true for a measurement of the free charge carrier concentration outside of the calibration piece.

The thermal donors concentration [DT] may be calculated from the measured values of electrical resistivity (or free charge carrier concentration) using the usual relationships of resistivity and mobility of charge carriers. It is nevertheless desirable, as indicated in the patent FR2964459, to modify the mobility relation in order to take into account the influence of thermal donors.

Finally, at step S5, the total time $t_{tot}$ of the annealing at $T_C$=450° C., equivalent in terms of activation of thermal donors to the annealing carried out at step S3 (rise and drop in temperature of the furnace, phases of instability of temperature, to plateau at 450° C.), is determined from the interstitial oxygen concentration [Oi] and the thermal donors concentration [DT] of the calibration piece, determined respectively at steps S2 and S4.

The time $t_{tot}$ may be calculated using a relation taken from the article ["Formation kinetics of oxygen thermal donors in silicon", Wijaranakula C. A. et al., Appl. Phys. Lett. 59 (13), pp. 1608, 1991]. This article describes the kinetic of thermal donors formation in silicon by annealing at 450° C.

According to the aforementioned article, the thermal donors concentration [DT], the initial concentration of interstitial oxygen [Oi] and the annealing time t at 450° C. are linked by the following relation:

$$[DT] = 4.51 \cdot 10^{-52} \times \left([Oi] \cdot \left(1 + \frac{2}{3}D_o \times t \times [Oi]^{2/3}\right)^{-3/2}\right)^{3.45} \times t^{1.02} \quad (2)$$

with $D_o$ the diffusion coefficient of interstitial oxygen at 450° C. ($D_o$=3.5×10$^{-19}$ cm$^2$/s).

By replacing the terms [DT] and [Oi] of the above relation (2) by the values measured at steps S2 and S4 respectively, a value of t equal to the desired total time $t_{tot}$ is obtained.

To calculate the total time $t_{tot}$, the above relation (2) is favoured because a set temperature $T_C$ equal to 450° C. is, in an embodiment, chosen for carrying out the annealing of ingot samples, in order to adjust their resistivity. The temperature of 450° C. is in fact that at which the kinetic of thermal donors formation is the best controlled. Moreover, it constitutes a good compromise between the formation rate of thermal donors and the maximum concentration obtained.

Alternatively, the time $t_{tot}$ may be determined by means of other mathematical expressions or abacuses, giving the thermal donors concentration [DT] as a function of the annealing time t at 450° C., for different values of the oxygen concentration [Oi].

For a set temperature different to 450° C., the mathematical expressions and the abacuses may be adapted notably thanks to the teachings of the article ["Effect of oxygen concentration on the kinetics of thermal donor formation in silicon at temperatures between 350 and 500° C.", Londos C. A. et al., Appl. Phys. Lett. 62 (13), pp. 1525, 1993]. This article also describes the kinetic of thermal donors formation in silicon, but for annealing temperatures comprised between 350° C. and 500° C.

The equivalent annealing time $t_{eq}$ at 450° C. is then determined from the total time $t_{tot}$ and the set time $t_c'$, by subtracting the set time $t_c'$ from the total time $t_{tot}$ (cf. relation (1)). Alternatively, the determination of the equivalent time $t_{eq}$ may be carried out in a single calculation step, from the oxygen concentration [Oi], the thermal donors concentration [DT] and the set time $t_c'$.

Steps S1-S5 of the calibration method are not necessarily carried out in the order that has just been described in relation with FIG. 3. In particular, step S2 of measuring the oxygen concentration [Oi] may be accomplished after the annealing S3 of the calibration piece, rather than before. In fact, the thermal donor formation annealing has practically no influence on the interstitial oxygen concentration. The oxygen concentration [Oi] may thus be measured on a wafer taken from inside the calibration piece, after the calibration piece has undergone the annealing S3. Step S2 could also be carried out after step S4 of determining the concentration of thermal donors formed by the annealing S3.

Even though they are not very frequent, differences between the sample temperature and the set temperature $T_C$ may be present at the end of the set time $t_c$ of the annealing of the sample. In order to be able to take into account these late differences, the set time $t_c'$ of the annealing S3 must be at least as long as the time of the phase concerned by these temperature differences.

The set time $t_c'$ of the annealing S3 may vary as a function of the shape and the dimensions of the calibration piece (in particular if they are different to those of the sample), the interstitial oxygen concentration of the semiconductor material and the furnace used to carry out the annealings. For example, a short time $t_c'$ may be chosen when it is known that the furnace is rather stable in temperature. The calibration method then gains in execution time.

Unless otherwise indicated, the set time selected for the calibration will be beneficially chosen between 30 seconds and 2 hours. This time range constitutes a good compromise between a time sufficiently long so that the temperature in the volume of the calibration piece is stabilised (at the set temperature) and a short time such that the quantity of thermal donors obtained during the plateau of the calibration piece is not preponderant with respect to that obtained during the phases of rise and drop in temperature. The ratio between the quantity of thermal donors obtained during the plateau over the quantity of thermal donors obtained during the phases of rise and drop in temperature is beneficially less than 10.

In certain annealing furnaces and/or for certain dimensions of samples, the temperature $T_S$ of the sample may not be stable during a considerable time during the plateau P2, due to problems of regulation of the furnace temperature.

For example, the sample temperature $T_S$ may exceed the set temperature $T_C$ at the start of the plateau P2, shortly after the phase P1 of rise in temperature. The calibration method makes it possible to take into account at least in part such an exceeding (like any difference in temperature with the set temperature $T_C$ during the set time $t_c'$), and in a complete manner if the set time $t_c'$ of the annealing S3 is greater than or equal to the exceed time. However, since the exceed time is not known, it may not be guaranteed that the set time $t_c'$ chosen will take account of the exceeding as a whole.

To overcome this, the calibration method (i.e. steps S1 to S5) may be carried out several times with a plurality of calibration pieces, in an embodiment between 4 and 10 times. The calibration pieces used are beneficially identical in every aspect (material, shape and dimensions). Different set time $t_c'$ values are chosen for the annealing S3 of the calibration pieces. Except for the set time, the annealing S3 is the same for all the calibration pieces.

Figure 5:
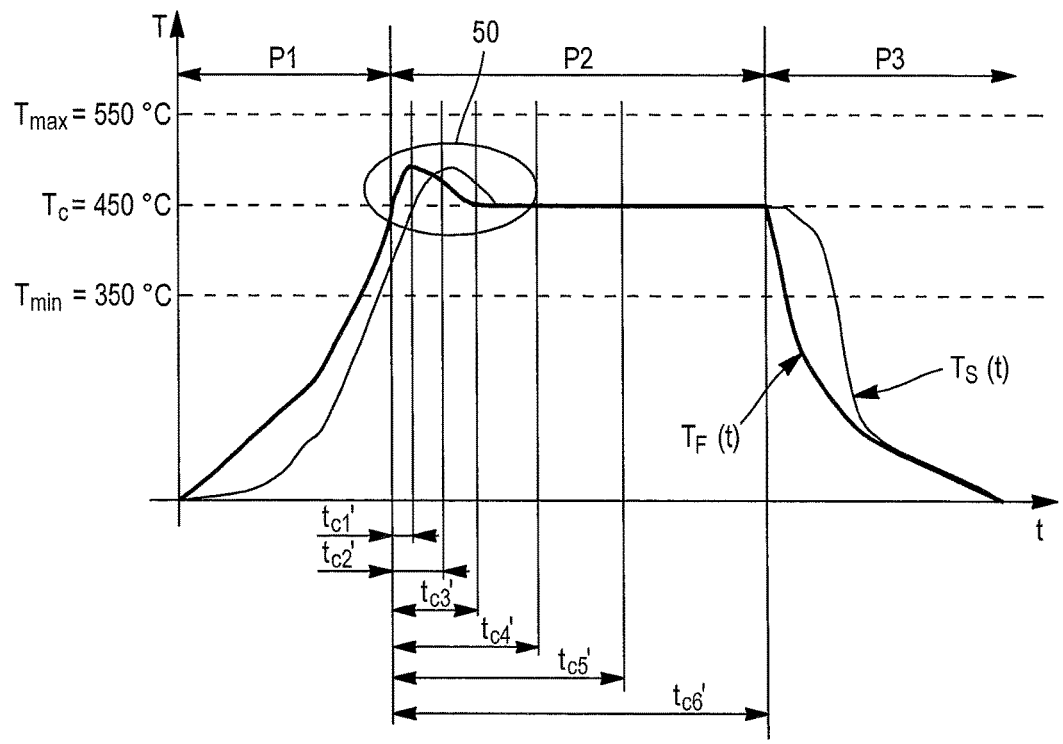
FIGS. 5 and 6 respectively show an exceeding of the temperatures of the sample and the furnace during annealing (compared to the set temperature) and in what manner this exceeding may be entirely taken into consideration in the calibration method of an embodiment of the invention.

As an example, FIG. 5 represents on the level of the plateau P2 an exceed phase 50 where the furnace temperature $T_F$ and the sample temperature $T_S$ exceed the set temperature $T_C$. Six different values of set time, noted $t_{c1}'$ to $t_{c6}'$, are chosen between 30 s and 2 hours. The values $t_{c1}'$ to $t_{c6}'$ are chosen so as to cover a wide time range, so that at least one of them is greater than the exceed time.

A plurality of equivalent time $t_{eq1}$-$t_{eq6}$ values, associated with the different calibration pieces and with the corresponding set times $t_{c1}'$ to $t_{c6}'$ is then obtained. Then, during a final step, the minimum set time, beyond which the equivalent time $t_{eq}$ is constant, is determined. The determination of the minimum set time may be carried out after having transferred onto the graph the equivalent time values obtained as a function of the corresponding set time values.

Figure 6:
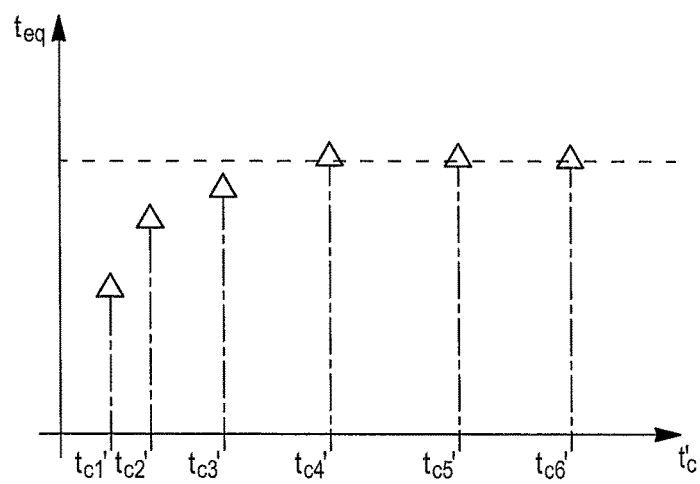

FIG. 6 is a graph $t_{eq}(t_c')$ corresponding to the example of FIG. 5. It may be seen in this graph that the equivalent time $t_{eq}$ is independent of the set time $t_c'$, from $t_c'$=$t_{c4}'$. In fact, as may be seen in FIG. 5, "$t_{c4}'$" is the smallest of the set time values covering the exceeding in its entirety.

Thus, the determination of the minimum set time guarantees that an exceeding of temperature (and in a more general manner, any difference between the set temperature $T_C$ and the temperature of the sample) at the start of the plateau is taken into account in its entirety. The minimum set time may be determined for each furnace and/or each size of sample.

It will be noted that it is desirable to determine the minimum set time with calibration pieces of large dimensions, because the problem of instability of the temperature is amplified with such pieces. The same minimum set time could then to be used for pieces of smaller size.

Figure 7:
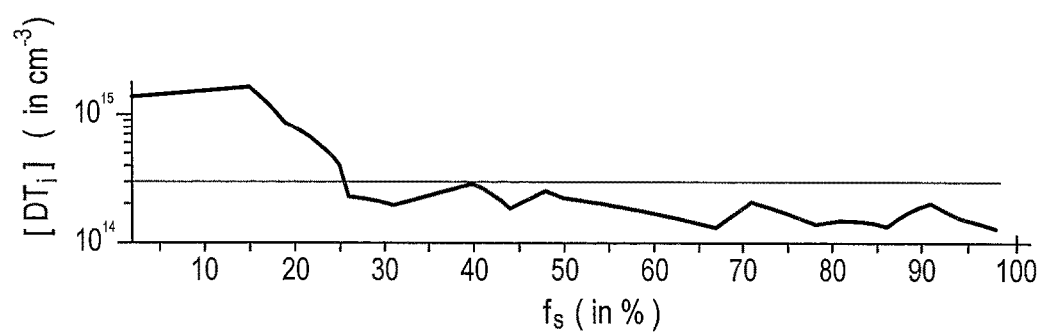
FIG. 7 illustrates the concentration of thermal donors formed during crystallisation of a Cz type silicon ingot, as a function of the solidified fraction of the ingot.

As indicated previously, the calibration piece may be obtained from an ingot of Cz silicon crystallised from an intrinsic silicon melt. FIG. 7 is a graph representing the initial thermal donors concentration $[DT_i]$, formed during the crystallisation of such an ingot, as a function of the solidified fraction $f_s$ of the ingot (expressed in % of the total length of the ingot).

It may be deducted from the graph that the initial thermal donors concentration $[DT_i]$ of the ingot decreases rapidly, and is then maintained at a low level. From a solidified fraction $f_s$ of around 25%, all the concentration values $[DT_i]$ are less than or equal to $3 \times 10^{14}$ cm$^{-3}$.

This zone of low concentration $[DT_i]$ is considered as being the portion of the ingot solidified last, known as the "ingot foot". The ingot foot contains fewer initial thermal donors than the ingot head, i.e. the portion of the ingot solidified first, because the ingot foot is in thermal contact with the molten silicon for less time than the ingot head.

When the calibration piece is obtained from an ingot of Cz silicon, the calibration piece is beneficially cut from the ingot foot ($f_s \geq 25\%$). It may then be assumed that the initial thermal donors concentration $[DT_i]$ is negligible compared to the concentration [DT] of thermal donors formed during the annealing S3. This makes it possible to simplify the calibration method by using, at step S4 of determining the thermal donors concentration [DT], a single value of the resistivity or the free charge carrier concentration. In fact, the free charge carrier concentration is then assumed equal to two times the thermal donors concentration [DT].

Figure 8A:
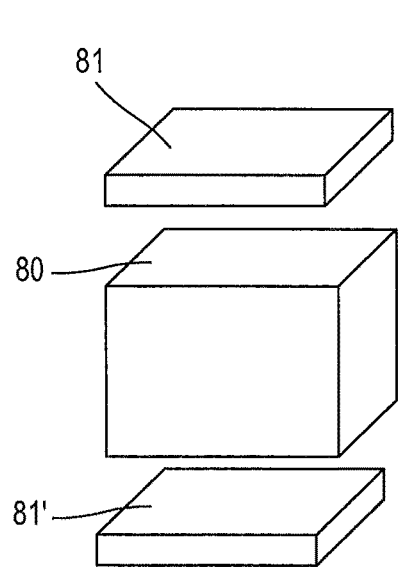
FIG. 8A represents the step of measuring the electrical resistivity or the free charge carrier concentration, which precedes the thermal donor formation annealing of the calibration piece.

An exemplary embodiment of the calibration method will now be described in relation with FIGS. 8A and 8B. This example relates to a brick-shaped sample of Cz silicon, of square section equal to 156×156 mm² and of 100 mm height. It is desired to subject this sample to a thermal donor formation annealing under air, the annealing comprising a plateau at 450° C. The annealing furnace used is heated by means of metal resistances. In order to avoid the risk of breakage, the following cooling procedure is applied:
  the electrical power supply to the metal resistances is turned off after the plateau at 450° C. and the door of the furnace remains closed for 30 min;
  after opening the door of the furnace, the brick is left in the furnace for two hours; then
  the brick is removed from the furnace and left at ambient temperature.

A calibration piece 80 (FIG. 8A) is extracted from a Cz silicon ingot obtained from an intrinsic silicon load, of electronic grade. The diameter of the ingot is 9 inches.

The calibration piece 80 is sawn in the ingot portion solidified last, situated at a fraction $f_s$ greater than 50%. The calibration piece 80 has the same shape and the same dimensions as the sample (156 mm×156 mm×100 mm).

Two wafers 81 and 81' are also cut from the ingot, respectively above and below the calibration piece 80. These wafers have main square surfaces (156×156 mm²) and a thickness of around 500 µm.

The interstitial oxygen concentration [Oi] is measured (step S2) at the centre of one of the main faces of each wafer 81, 81' thanks to the technique described in the patent FR2964459. The concentration [Oi] is equal to $8.32 \times 10^{17}$ cm$^{-3}$ on the upper wafer 81 and to $8.38 \times 10^{17}$ cm$^{-3}$ on the lower wafer 81'. The electrical resistivity is also measured at the centre of the wafers 81 and 81'. It is equal to 38 Ω·cm on the upper wafer 81 and to 40 Ω·cm on the lower wafer 81'. The hypothesis is made that the values of the concentration [Oi] and the resistivity in the calibration piece 80 are equal to the average of the values measured on the two wafers 81 and 81'.

Then, the calibration piece 80 undergoes an annealing in the same furnace, with a temperature plateau at 450° C. for a set time equal to 30 min (step S3). The same cooling procedure is used.

Figure 8B:
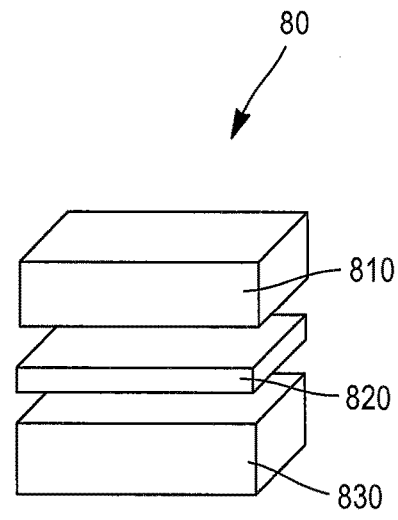
FIG. 8B represents the step of measuring the electrical resistivity or the free charge carrier concentration, which follows the thermal donor formation annealing of the calibration piece.

At the end of the annealing, the calibration piece is sawn into three parts 810, 820 and 830 (FIG. 8B). The part taken from the centre of the calibration piece 80 is a wafer 820, square-shaped, of thickness equal to around 500 µm. The resistivity after annealing is measured at the centre of one of the main faces of this wafer 820.

The thermal donors concentration [DT] formed in the calibration piece 80 during the annealing is calculated from the average resistivity value before annealing and the resistivity value measured after annealing on the wafer 83. It is equal in this example to $9.05 \times 10^{13}$ cm$^{-3}$.

Finally, the annealing time $t_{eq}$ at 450° C., equivalent to the heating and cooling phases of the furnace, as well as any difference in the temperature of the sample compared to 450° C., is calculated using the relation (2), knowing the thermal donors concentration [DT] and the interstitial oxygen concentration [Oi]. In this example it is equal to 12 minutes.

Numerous variants and modifications of the calibration method will become clear to those skilled in the art. In particular, the calibration method may comprise, before the first resistivity (or free charge carrier concentration) measurement, a step in which the calibration piece is subjected to an annealing at a temperature greater than or equal to 600° C. This annealing at 600° C. or above eliminates the thermal donors formed during the crystallisation of the ingot. The initial resistivity value (before the annealing S3) is then higher, which makes it possible to refine the calculation of the concentration of thermal donors formed in the course of the annealing S3. An annealing at a temperature greater than or equal to 600° C. may also be carried out at the end of the calibration method to destroy the thermal donors formed during the annealing S3. It is beneficially followed by a resistivity (or free charge carrier concentration) measurement with the aim of improving the precision of the calculations.

Finally, although the calibration method has been described in relation with samples and calibration pieces made of silicon, it could be applied to other semiconductor materials, for example germanium or silicon-germanium alloy. Germanium is a potential candidate, because oxygen-based thermal donors can also be formed by annealing in germanium.

The invention claimed is:

1. A method for calibrating a furnace by determining an equivalent annealing time corresponding at least to a rise and a drop in temperature of the furnace so as to take into account a formation of thermal donors during heating and cooling phases of the furnace when a sample of semiconductor material is subjected to a first annealing in said furnace, the first annealing successively comprising the rise in temperature of the furnace, a first plateau at a set temperature and the drop in temperature of the furnace, the method comprising:
   a) providing a calibration piece comprised of the semiconductor material;
   b) determining the interstitial oxygen concentration of the calibration piece;
   c) subjecting the calibration piece to a second thermal donor formation annealing in the furnace, the second annealing comprising rise and drop in temperature of the furnace identical to those of the first annealing and a second plateau at the set temperature for a set time;
   d) determining the concentration of thermal donors formed in the calibration piece during the second annealing;
   e) determining the equivalent annealing time at the set temperature, corresponding at least to said rise and drop in temperature of the furnace, from the interstitial oxygen concentration, the thermal donor concentration of the calibration piece and the set time.

2. The method according to claim 1, wherein steps a)-e) are carried out for a plurality of calibration pieces having different set time values, resulting in a plurality of equivalent time values, the method further comprising determining the set time value above which the equivalent time is independent of the set time.

3. The method according to claim 1, wherein the calibration piece has a geometry and dimensions identical to those of the sample.

4. The method according to claim 3, wherein the set time is comprised between 30 seconds and 2 hours.

5. The method according to claim 1, wherein the calibration piece is cut from a semiconductor material ingot crystallised according to the Czochralski method.

6. The method according to claim 5, wherein the interstitial oxygen concentration of the calibration piece is determined by measuring the interstitial oxygen concentration on at least one scrap stemming from the cutting of the ingot, said scrap being adjacent to the calibration piece in the ingot.

7. The method according to claim 5, wherein the thermal donor concentration is determined from a first measurement of an electrical resistivity or a free charge carrier concentration, carried out before the second annealing on a first wafer adjacent to the calibration piece in the ingot, and from a second measurement of the electrical resistivity or the free charge carrier concentration, carried out after the second annealing on a second wafer taken from the calibration piece.

8. The method according to claim 5, wherein the semiconductor material ingot is obtained from a melt of intrinsic semiconductor material.

9. The method according to claim 8, wherein the calibration piece is cut from a part of the ingot crystallised last.

* * * * *